United States Patent [19]

Satoh

[11] 4,092,640
[45] May 30, 1978

[54] KEY INPUT MEANS HAVING A SWITCHING ELEMENT MADE OF A LIGHT EMITTING DIODE

[75] Inventor: Masaharu Satoh, Minoo, Japan

[73] Assignee: Sharp Kabushiki Kaisha, Osaka, Japan

[21] Appl. No.: 726,557

[22] Filed: Sep. 27, 1976

[30] Foreign Application Priority Data

Sep. 27, 1975 Japan .......................... 50-132123[U]

[51] Int. Cl.² .............................................. G06F 3/02
[52] U.S. Cl. ................................ 340/365 R; 200/310;
307/116; 357/74
[58] Field of Search .......... 340/365 R, 365 C, 365 E,
340/365 S; 58/50 R, 23 BA; 313/323; 307/239,
116, 125; 250/552, 553; 200/DIG. 1, 308, 310,
313, 317; 357/74; 317/DIG. 1; 361/437

[56] References Cited

U.S. PATENT DOCUMENTS

| 3,581,124 | 5/1971 | Flores et al. ...................... 340/365 C |
| 3,683,370 | 8/1972 | Nagano et al. .................... 340/365 E |
| 3,732,389 | 5/1973 | Kaelin et al. ...................... 200/313 |
| 3,737,670 | 6/1973 | Larson ........................... 200/DIG. 1 |
| 3,772,685 | 11/1973 | Masi ................................ 340/365 C |
| 3,879,618 | 4/1975 | Larson ............................. 340/365 R |
| 3,971,013 | 7/1976 | Challoner et al. ................ 340/365 C |

*Primary Examiner*—Caldwell, Sr. John W.
*Assistant Examiner*—James J. Groody
*Attorney, Agent, or Firm*—Birch, Stewart, Kolasch & Birch

[57] ABSTRACT

A light emitting diode has a metal casing connected to the cathode electrode thereof to protect the light emitting diode from the ambient conditions. Detector circuitry is provided for detecting touch operation by an operator to the metal casing of the light emitting diode. A driver is responsive to the output of the detector circuitry for enabling the light emitting diode when the touch operation is effected to the metal casing of the light emitting diode.

9 Claims, 9 Drawing Figures

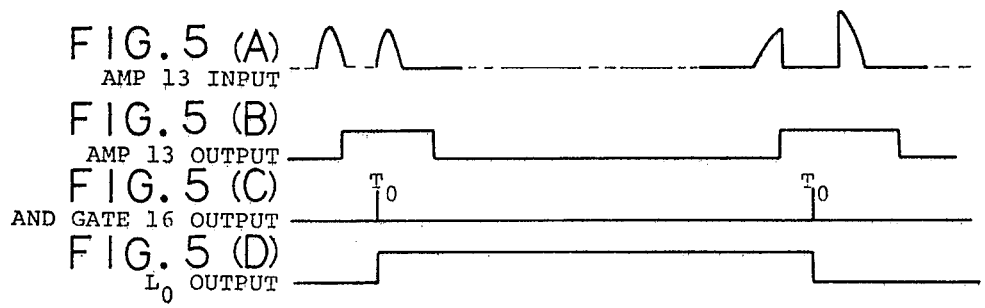
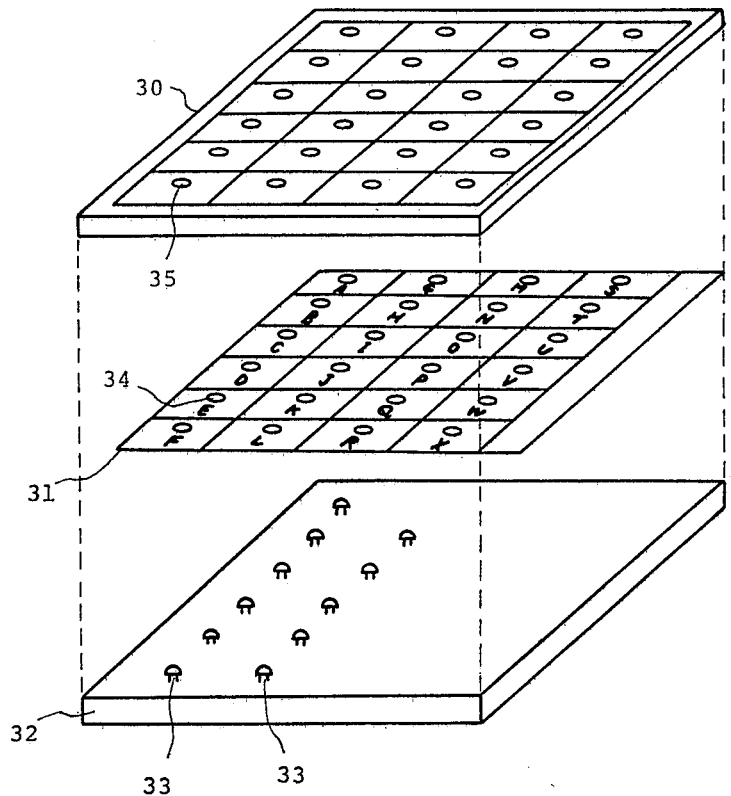
FIG. 6

KEY INPUT MEANS HAVING A SWITCHING ELEMENT MADE OF A LIGHT EMITTING DIODE

BACKGROUND AND SUMMARY OF THE INVENTION

The present invention relates to a key input means which itself indicates an input condition and, more particularly, to a key input means having a switching element made of a light emitting diode.

A conventional mechanical switch of the depression type can be associated with a lamp so as to indicate a switching condition of the mechanical switch, or, to indicate the depression operation effected to the mechanical switch. However, the above-mentioned mechanical switch requires a large space and, therefore, such a mechanical switch is not suited for a keyboard means including a large number of switching elements aligned thereon. Moreover, the above-mentioned mechanical switch is not suited for rapid operation, because the mechanical switch requires a considerably long operation stroke to ensure stable operation.

Accordingly, an object of the present invention is to provide a key input means which itself indicates an input condition.

Another object of the present invention is to provide a key input means suited for a keyboard means which can indicate the switching condition of the respective switching elements.

Still another object of the present invention is to provide a key input means suited for rapid operation.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a metal casing of a light emitting diode is electrically connected to the cathode electrode of the light emitting diode. A detection means is provided for detecting the touch operation of the operator to the metal casing of the light emitting diode, thereby developing a key input signal. A driver is further provided to enable the light emitting diode in response to the output signal, or, the key input signal derived from the detection means.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

FIGS. 5(A) through 5(D) are time charts showing waveforms of signals occurring within the circuit of FIG. 4; and FIG. 6 is an exploded perspective view of an embodiment of a key input means of the present invention.

DESCRIPTION OF THE PREFERRED EMBODIMENTS

Figures 1, 2:
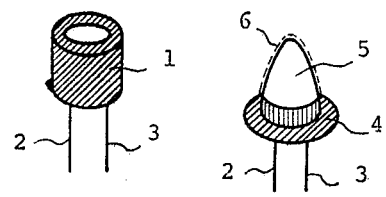
FIG. 1 is a perspective view of an example of a light emitting diode suitable for use as a key input means of the present invention.
FIG. 2 is a perspective view of another example of a light emitting diode suitable for use as a key input means of the present invention.

FIG. 1 shows an example of a light emitting diode suitable for use as a key input means of the present invention. A light emitting diode element is secured within a flat cap 1 made of metal. A lead 2 is connected to an anode electrode of the light emitting diode element, and a lead 3 is connected to a cathode electrode of the light emitting diode element.

FIG. 2 shows another example of a light emitting diode suitable for use as the key input means of the present invention. The light emitting diode element is mounted on a TO-type stem 4 made of metal, and is coated with a transparent resin mold 5. The leads 2 and 3 are connected to the anode electrode and the cathode electrode of the light emitting diode element, respectively. The TO-type stem 4 and the flat cap 1 are electrically connected to the cathode electrode of the light emitting diode element, and are used as a control terminal of a switching element. In a preferred form, a transparent conductive film 6 is formed on the surface of the resin mold 5 through the use of evaporation techniques, thereby increasing the area of the control terminal of the switching element.

Figure 3:
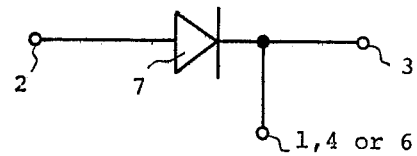
FIG. 3 is a schematic circuit diagram of an equivalent circuit of the light emitting diodes of FIGS. 1 and 2.

FIG. 3 shows an equivalent circuit of the light emitting diode shown in FIGS. 1 and 2. The flat cap 1, or the stem 4 and the transparent conductive film 6 are connected to the cathode terminal 3 of a light emitting diode chip 7. When the operator touches the flat cap 1 or the transparent conductive film 6, the electrical potential of the human operator appears at the cathode terminal 3. When a detector is provided for detecting the potential of the cathode terminal 3, a key input signal can be developed, and the light emitting diode chip 7 can be enabled by providing a driver circuit responsive to the above-mentioned detector.

Figure 4:
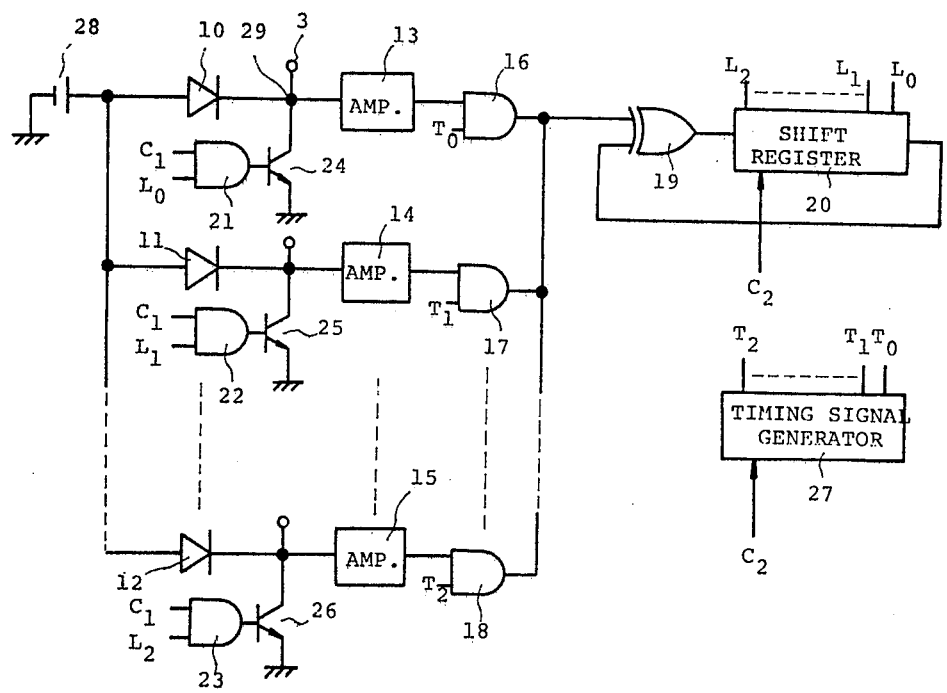
FIG. 4 is a block diagram of an embodiment of a key input means of the present invention.

FIG. 4 shows an embodiment of a key input means of the present invention, which includes a plurality of the light emitting diodes acting as switching elements. The key input means mainly comprises light emitting diode chips 10, 11 and 12, amplifiers 13, 14 and 15, AND gates 16, 17, 18, 21, 22 and 23, an exclusive-OR gate 19, a shift register 20, and transistors 24, 25 and 26. Respective output signals of the AND gates 16, 17 and 18 are applied to the shift register 20 via the exclusive-OR gate 19. Output terminals of the AND gates 21, 22 and 23 are connected to the cathode terminals of the light emitting diode chips 10, 11 and 12 through the collectors of the transistors 24, 25 and 26, respectively.

One of the input terminals of the AND gates 21, 22 and 23 are, respectively, connected to receive output signals $L_0$, $l_1$ and $L_2$ of the shift register 20, and the other input terminals of the AND gates 21, 22 and 23 are connected to receive a clock signal $C_1$. The shift register 20 is driven to circulate its contents in response to a clock signal $C_2$. The clock signal $C_1$ is a lower frequency as compared with the clock signal $C_2$, and these clock signals $C_1$ and $C_2$ are developed in a manner well known in the art.

One of the input terminals of the AND gates 16, 17 and 18 are, respectively, connected to receive output signals of the amplifiers 13, 14 and 15, and the other input terminals of the AND gates 16, 17 and 18 are, respectively, connected to receive timing signals $T_0$, $T_1$ and $T_2$ which are developed from a timing signal generator 27 in a time division fashion through the use of the clock signal $C_2$. The anode terminals of the light emitting diode chips 10, 11 and 12 are commonly connected to a power supply source 28, and the cathode terminals of the light emitting diode chips 10, 11 and 12 are, respectively, grounded through the collector-emitter of the transistors 24, 25 and 26.

When the operator touches the metal cap of the light emitting diode chip 10, the human potential of the human operator appears at a cathode terminal 29, and the thus occurred human potential is introduced into the amplifier 13. Thereafter, the AND gate 16 develops a detection signal in synchronization with the timing signal $T_0$. The thus developed detection signal is applied to the shift register 20 through the exclusive-OR gate 19, whereby the shift register 20 develops the output signal $L_0$. The output signal $L_0$ is applied to the AND gate 21 and, accordingly, the AND gate 21 becomes conductive in response to the clock signal $C_1$. This renders the transistor 24 conductive and, therefore, the light emitting diode chip 10 becomes conductive and emits light, because the cathode terminal 29 of the light emitting diode chip 10 is grounded.

FIGS. 5(A) through 5(D) show waveforms of signals occurring within the circuit of FIG. 4.

It will be clear from FIG. 5(A) that the cathode terminal 29 is not maintained at any certain potential during the period shown by dotted lines in FIG. 5(A), even when the light emitting diode chip 10 emits light. When the operator again touches the metal cap of the light emitting diode chip 10, the amplifier 13 develops an output signal in synchronization with the period when the cathode terminal 29 is not maintained at any certain potential, whereby the $L_0$ information stored in the shift resistor 20 is erased by the output signal of the exclusive-OR gate 19. Therefore, the AND gate 21 is not conductive and, hence, the light emitting diode ceases to emit light.

FIG. 6 shows an input means of a file retrieval system employing a key input means of the present invention. The input means of the file retrieval system includes a transparent display panel 30, a file board 31 on which labels are formed, and a keyboard 32 on which a plurality of light emitting diodes 33, constructed as shown in FIG. 2, are aligned in a matrix pattern. The light emitting diodes 33 are extruded through openings 34 and 35 formed in the corresponding positions of the file board 31 and the transparent display panel 30. The thus extruded ends of the light emitting diodes 33 act as the switching terminals. The input means of the file retrieval system of FIG. 6 is very convenient, since the input condition is displayed through the use of the light emitting diodes 33.

The invention being thus described, it will be obvious that the same way be varied in many ways. Such variations are not to be regarded as a departure from the spirit and scope of the invention, and all such modifications are intended to be included within the scope of the following claims.

What is claimed is:

1. A key input means comprising:
   a. a light emitting diode;
   b. a metal cap formed on or around the light emitting diode and electrically connected with the cathode terminal of the light emitting diode;
   c. a detection means connected to the cathode terminal of the light emitting diode for developing a detection signal when the operator touches the metal cap; and
   d. a driving means for activating the light emitting diode in response to the detection signal derived from the detection means.

2. The key input means of claim 1, wherein the light emitting diode comprises a light emitting diode chip, a resin molded onto the light emitting diode chip, and said metal cap includes a transparent metal film formed on the molded resin, the transparent metal film being electrically connected to the cathode terminal of the light emitting diode.

3. The key input means of claim 2, wherein the transparent metal film is formed through the use of evaporation techniques.

4. The key input means of claim 1, wherein the detection means comprises an amplifier for detecting the electric potential of a human operator appearing at the cathode terminal of the light emitting diode, and an AND gate for developing the detection signal in response to the output signal of the amplifier.

5. The key input means of claim 4, which further comprises a shift register connected to receive the output signal of the AND gate and, wherein the AND gate is connected to receive the output signal of the amplifier and a timing signal for controlling the introduction of the detection signal into the shift register.

6. The key input means of claim 5, which further comprises an exclusive-OR gate through which the detection signal derived from the AND gate is applied to the shift register and the contents of the shift resister are circulated.

7. The key input means of claim 1, wherein the driving means comprises a switching transistor interposed between the cathode terminal of the light emitting diode and the grounded terminal.

8. A keyboard means comprising:
   a. a plurality of light emitting diodes;
   b. metal caps formed on or around the each of said light emitting diodes and electrically connected with the respective cathode terminals of the light emitting diodes;
   c. detection means connected to the respective cathode terminals of the light emitting diodes for developing detection signals when the operator touches the metal caps formed on or around the light emitting diodes; and
   d. driving means for activating the corresponding light emitting diodes in response to the detection signals derived from the detection means.

9. The keyboard means of claim 8, wherein the plurality of light emitting diodes are aligned in a matrix pattern.

* * * * *